(12) United States Patent
Brench

(10) Patent No.: US 7,498,524 B2
(45) Date of Patent: Mar. 3, 2009

(54) ENCLOSURE AND GASKET ASSEMBLY FOR REDUCING EMI

(75) Inventor: Colin E. Brench, Allen, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/738,895

(22) Filed: Apr. 23, 2007

(65) Prior Publication Data

US 2008/0259587 A1    Oct. 23, 2008

(51) Int. Cl.
*H05K 9/00* (2006.01)
(52) U.S. Cl. .................. 174/354; 174/355; 174/356; 174/369; 277/920; 361/800
(58) Field of Classification Search ......... 174/354–356, 174/369, 370; 277/920; 361/816, 818, 800
See application file for complete search history.

(56) References Cited

U.S. PATENT DOCUMENTS

| | | | | |
|---|---|---|---|---|
| 4,910,920 A | * | 3/1990 | Nichols | .................... 49/484.1 |
| 5,126,185 A | * | 6/1992 | Forrest et al. | ................ 428/157 |
| 5,504,657 A | * | 4/1996 | Bellino et al. | ................ 361/800 |
| 6,043,992 A | * | 3/2000 | Scheibler | ..................... 361/818 |
| 6,395,976 B1 | * | 5/2002 | Koradia et al. | .............. 174/359 |
| 6,483,023 B1 | * | 11/2002 | Jacques | ...................... 174/358 |
| 6,653,556 B2 | * | 11/2003 | Kim | .......................... 174/358 |
| 6,660,932 B1 | * | 12/2003 | Barringer et al. | ............ 174/358 |

FOREIGN PATENT DOCUMENTS

JP          11-145670      *  5/1999

* cited by examiner

*Primary Examiner*—Hung V Ngo

(57) ABSTRACT

Enclosures and gasket assemblies for reducing EMI for computer systems and other electronic devices are disclosed. In an exemplary embodiment a gasket assembly for reducing EMI may comprise a soft core sizable to extend along at least the length of an opening in an EMI housing. The gasket assembly may also comprise a plurality of fingers positionable at spaced-apart positions along the entire length of the opening in the EMI housing, the plurality of fingers maintaining conductivity between mating surfaces of the EMI housing.

15 Claims, 5 Drawing Sheets

ENCLOSURE AND GASKET ASSEMBLY FOR REDUCING EMI

BACKGROUND

Operation of computer systems and other electronic devices may generate electromagnetic fields (EM fields) in the radio frequency (RF) spectrum. These energies, referred to as electromagnetic interference (EMI) may cause "noise" or otherwise degrade performance of other computer systems and electronic devices. Accordingly, computer systems and other electronic devices may be shielded to reduce emissions which cause EMI and disrupt the operation of other equipment. Computer systems and electronic devices may also be shielded against EMI caused by other equipment in order to function properly in the intended environment.

Filters have been developed to reduce emissions that cause EMI. However, EMI filters may require modifying the circuitry, can be expensive, and do not protect against EMI caused by other computer systems or electronic devices. Alternatively, shielding may be used to reduce emissions that cause EMI. Shielding may be accomplished by enclosing circuits or other sources of EMI. Shielding also protects against EMI caused by other computer systems or electronic devices.

EMI shielding may be accomplished by sealing openings in enclosure with foam gaskets. These foam gaskets work well if the mating surfaces of the enclosure are highly conductive (e.g., metal). However, the materials used for these enclosures may include zinc or other heavy metals, and therefore may be insulated to comply with Reduction of Hazardous Substances (RoHS) standards. Obviously, foam gaskets cannot pierce this insulating layer, thereby reducing its effectiveness for EMI shielding.

Although a metal gasket may be used to pierce the insulating layer, metal gaskets typically requires relatively high compressive forces in order to pierce the insulating layer. Accordingly, the enclosure has to be designed to resist these forces. Such a design increases manufacturing costs and the size/weight of the final product, all of which are undesirable in electronic devices.

DETAILED DESCRIPTION

Embodiments of an enclosure and gasket assembly are disclosed. The enclosure may include sheet metal or other conductive material (e.g., metalized plastic). Seams and other openings in the enclosure may be sealed with a gasket assembly. The enclosure and gasket assembly work together to reduce or altogether eliminate emissions that can cause EMI. The enclosure and gasket assembly do not require modifications to any circuitry, while reducing emissions and protecting against external EMI caused by the operation of other computer systems and/or other electronic devices.

Figure 1:
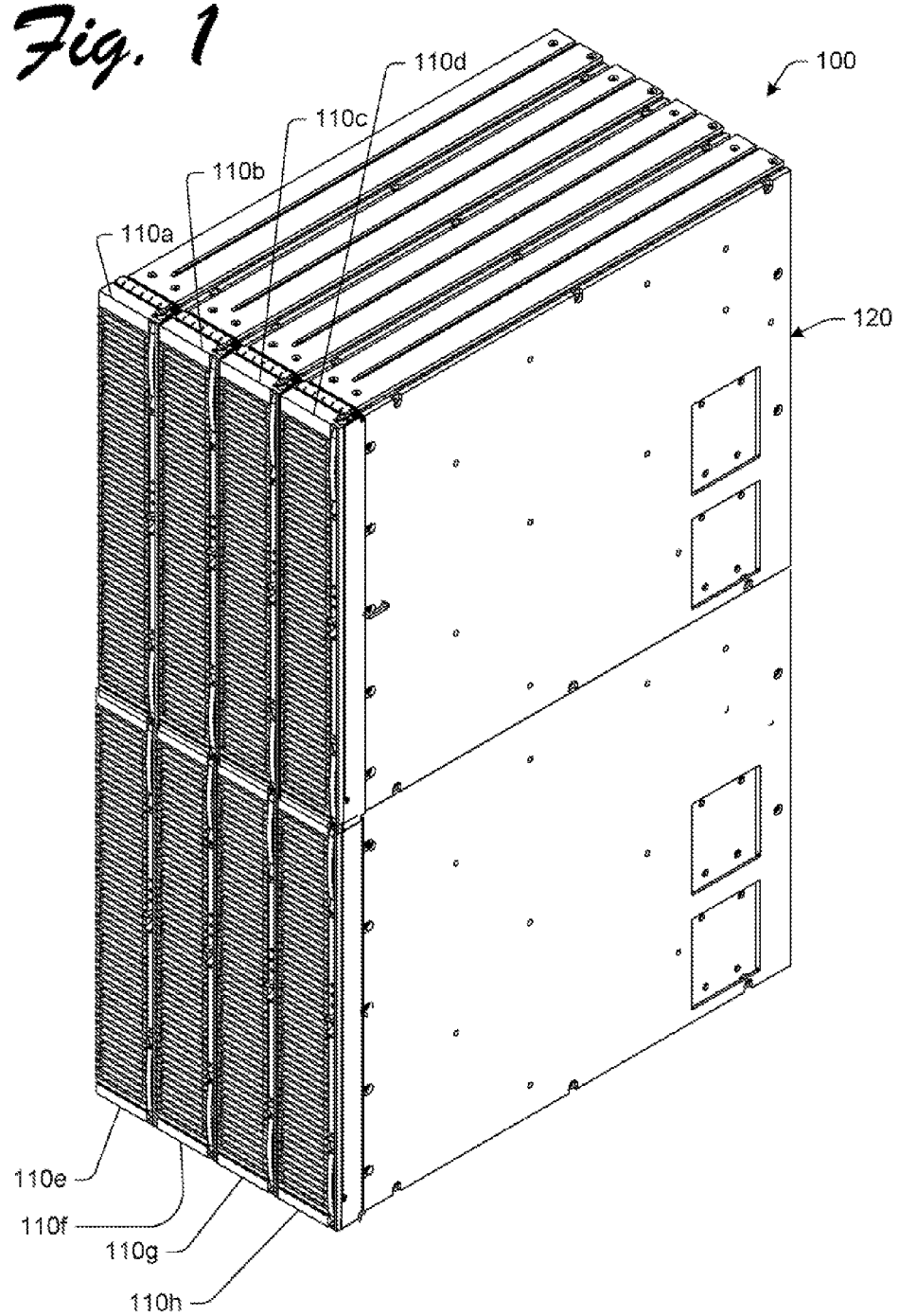
FIG. 1 is a front perspective view of an exemplary computer system which may implement EMI shielding.

FIG. 1 is a front perspective view of an exemplary computer system 100 which may implement EMI shielding. In one example, the computer system 100 may be a basic 8 processor system including eight separate modules 110a-h. Each of the separate modules 110a-h may be enclosed and bonded together by a gasket assembly to provide effective EMI shielding (as better seen in FIGS. 2 and 3).

In the basic 8 processor system, eight modules 110a-h are mounted in a chassis 120 in two rows of four each. Accordingly, each module 110a-h may be bonded to another module on the top (or bottom) and on at least one side. For example, module 110a is bonded to module 110b on the side and to module 110e on the bottom. Module 110f is bonded to modules 110e and 110g on the sides, and module 110b on the top.

It is noted, that the chassis 120 may be configured for any number of modules 110a-h. For example, the chassis 120 may also be configured for a single row of four modules. Other configurations are also contemplated. In addition, the enclosure and gasket assembly may also be implemented for components within each of the separate modules and/or for the chassis 120 itself, and is not limited to use only between the modules 110a-h, as will be readily appreciated by those having ordinary skill in the art after becoming familiar with the teachings herein.

Before continuing, it is noted that the embodiments of computer system 100 described herein are provided for purposes of illustration and are not intended to limit the enclosure and gasket assembly to use with any particular type or configuration of computer system or other electronic device.

Figure 2:
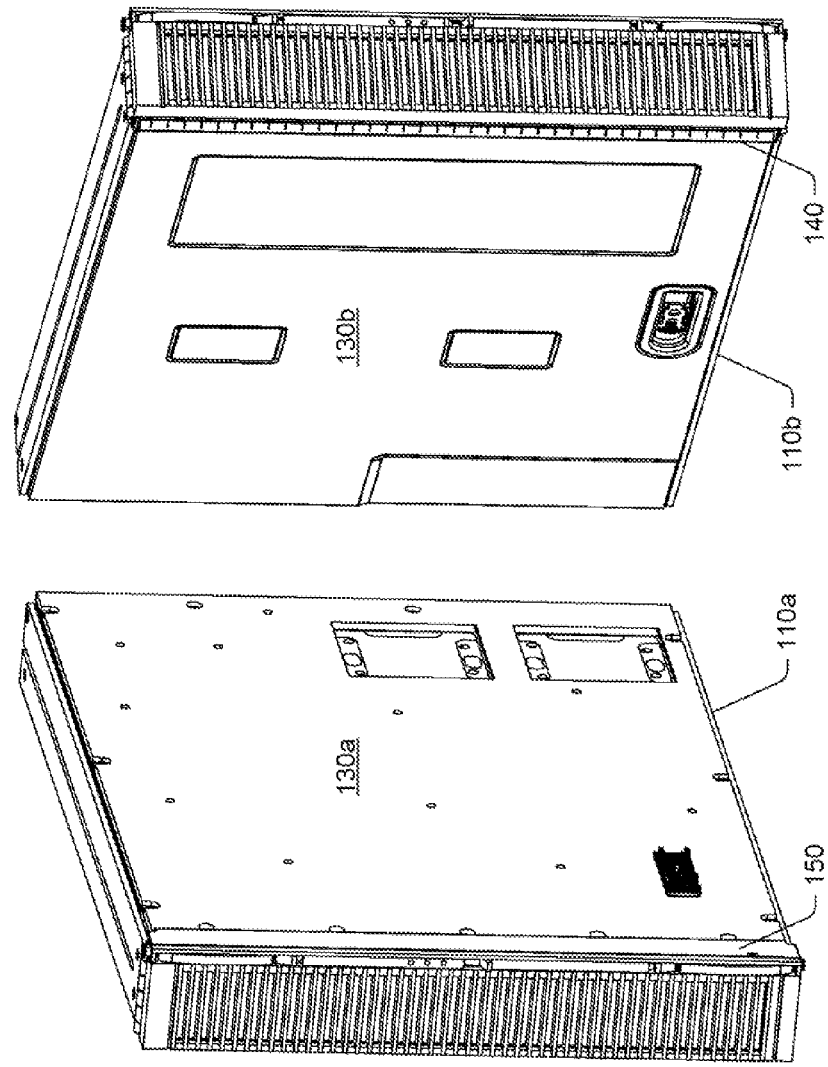
FIG. 2 is a perspective view of two modules of the computer system shown in FIG. 1 shown pulled apart from one another to illustrate the use of an exemplary enclosure and gasket assembly for EMI shielding.

FIG. 2 is a perspective view of two modules 110a and 110b of the computer system 100 shown in FIG. 1 shown pulled apart from one another to illustrate the use of exemplary enclosures 130a and 130b (respectively) and gasket assembly 140 (respectively) for EMI shielding. The enclosures 130a and 130b may be made of sheet metal or other conductive material (e.g., metalized plastic).

In this illustration, gasket assembly 140 on enclosure 130a may be used to bond the edge 150 of enclosure 130b to enclosure 130a. The other modules shown in FIG. 1 (e.g., modules 110a-h) may be similarly provided with gasket assemblies for bonding the edges of the enclosures to one another on the sides, top, and/or bottom in the chassis 120, as discussed above.

It is noted that the gasket assembly 140 may also be used to seal an opening in a single enclosure, and is not limited only to use between enclosures. For example, at least one opening formed between mating conductive surfaces (e.g., a door on an enclosure) may also be sealed for EMI.

Figure 3:
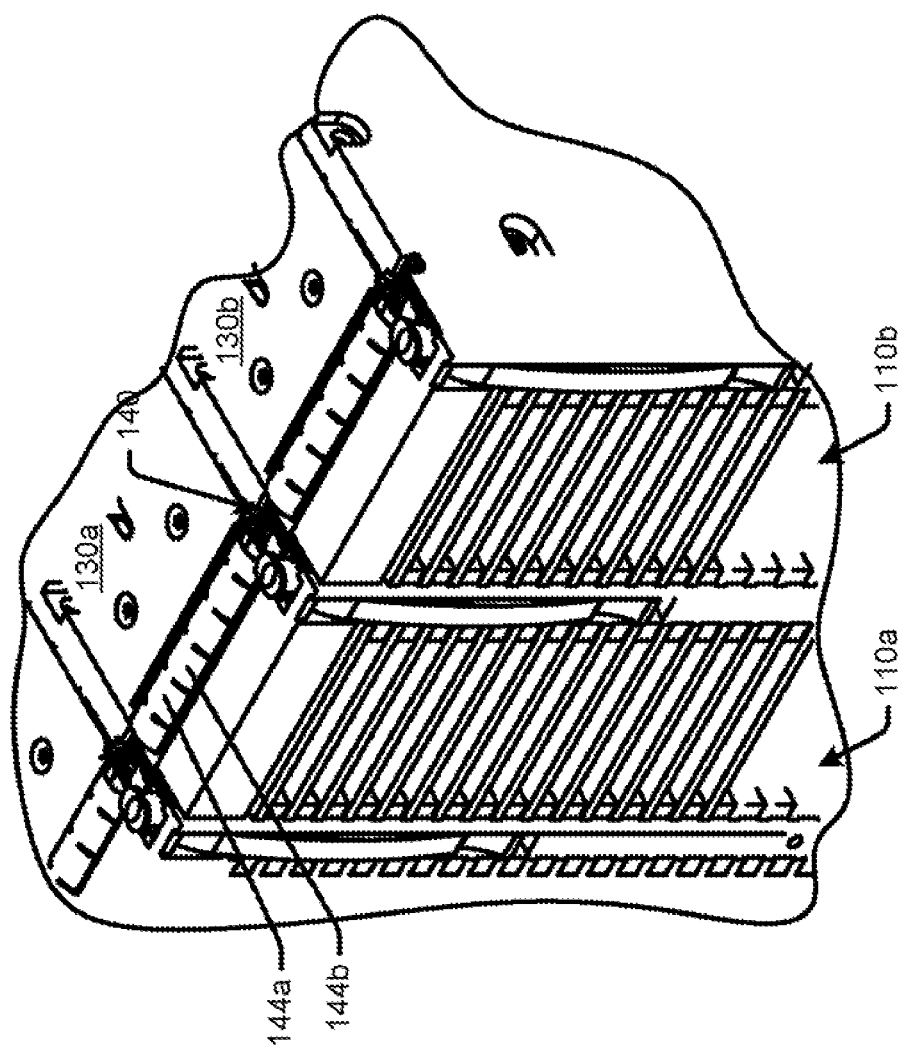
FIG. 3 is a detailed perspective view of the two modules in FIG. 2 showing the gasket assembly bonding the edges of enclosures.

FIG. 3 is a detailed perspective view of the two modules 110a and 110b in FIG. 2 showing the gasket assembly 140 bonding the edges of enclosures 130a and 130b. The gasket assembly 140 may include a soft core 142, such as, but not limited to, mesh, elastomers, and fabric bonded to foam. The gasket assembly may also include a plurality of spaced-apart, strong, conductive fingers 144 as shown in the figures.

Poor conductivity through the gasket assembly 140 may reduce the effectiveness of the EMI shielding, and may even act as an EMI antenna, serving to transmit energy instead of reduce EMI. Therefore, the fingers 144 are readily compressible, but sufficiently strong so as to readily pierce any insulating layer that may be provided on the enclosure 130a and 130b, as better seen in the illustration shown in FIGS. 4a and 4b. Accordingly, the fingers 144 serve to maintain conductivity between mating surfaces of the enclosures 130a and 130b.

Figure 4A:
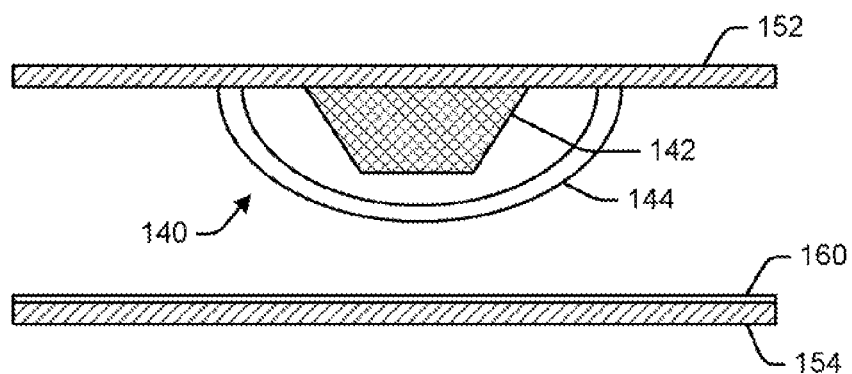
FIGS. 4a and 4b are high-level cross-sectional views showing the mating surfaces of exemplary enclosures and gasket assembly (a) in an open position, and (b) in a closed position.
Figure 4B:
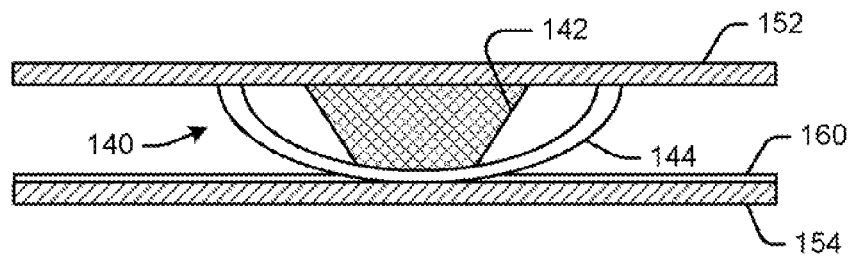

FIGS. 4a and 4b are high-level cross-sectional views showing the mating surfaces 152 and 154 of exemplary enclosures and gasket assembly (a) in an open position, and (b) in a closed position. The open position corresponds to an uncompressed state, e.g., as shown in FIG. 2 where the finger 144 of gasket assembly 140 is not in contact with the mating surface 154 of the enclosure. The closed position corresponds to a compressed state, e.g., as shown in FIG. 3 where the finger 144 of gasket assembly 140 is in contact with a mating surface 154.

Figure 5A:
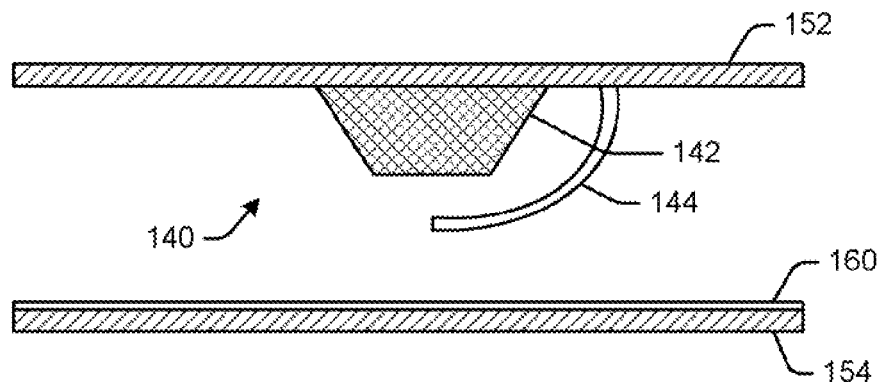
FIGS. 5a and 5b are other high-level cross-section views showing alternative embodiments of the gasket assembly wherein (a) the finger is positioned at least partially over the soft core, and (b) the finger is positioned adjacent the soft core.
Figure 5B:
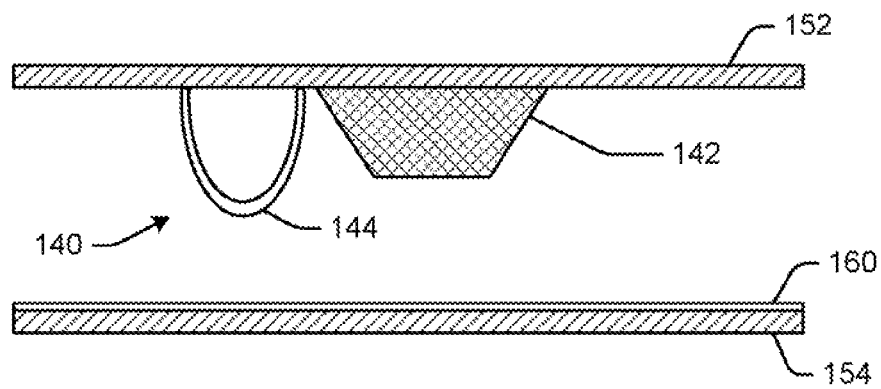

Although the finger 144 is shown positioned over the soft core 142 of gasket assembly 140, other embodiments are also contemplated. For example, the finger 144 may be at least partially over the soft core 142 (e.g., extending half way over the soft core), as shown in FIG. 5a. Alternatively, the finger 144 may be positioned next to or otherwise adjacent the soft core 142, as shown in FIG. 5b.

The gasket assembly 140 is also shown in FIG. 4b with the finger 144 having pierced the insulating layer 160 of mating surface 154. Accordingly, the gasket assembly 140 provides a low-impedance path for conducting current between mating surfaces 152 and 154 of the respective enclosures. At low frequencies the gasket assembly 140 may function as a resistor. At higher frequencies, the gasket assembly 140 may function as an inductor in series with a resistive load, or alternatively, as a shunt capacitor in parallel to a resistive load.

The gasket assembly 140 may also provide a wide functional frequency range. That is, the gasket assembly 140 provides good bonding of mating surfaces 152 and 154 of the enclosures to protect against emissions in the direct current (DC) through very high frequency (VHF) range. The soft core 142 of gasket assembly 140 may also provide bonding which reduces emissions in the VHF through microwave range.

It is noted that the exemplary embodiments discussed above are provided for purposes of illustration. Embodiments of the gasket assembly 140 described herein are not limited to use with any particular type or configuration of computer system. For example, gasket assembly 140 may be implemented with other computer systems, such as, e.g., a personal desktop or laptop computer. In addition, the gasket assembly is not limited to use with computer systems. For example, the gasket assembly 140 may also be implemented with any of a wide variety of other types of electronic devices or other EMI sources. It is also noted that the gasket assembly 140 may be implemented to shield against emissions which may cause EMI, as well as shielding against EMI caused by emissions from other computer systems or other electronic devices.

Still other embodiments are also contemplated. In addition to the specific embodiments explicitly set forth herein, other aspects and embodiments will be apparent to those skilled in the art from consideration of the specification disclosed herein. It is intended that the specification and illustrated embodiments be considered as examples only.

The invention claimed is:

1. A gasket assembly for reducing EMI, comprising:
a soft core configured to extend along an entire length of an opening in an EMI housing; and
a plurality of fingers positionable at spaced-apart positions along at least the length of the opening in the EMI housing, the plurality of fingers piercing an insulating layer of at least one mating conductive surface of the EMI housing to maintain conductivity between the at least one mating conductive surface and another mating conductive surface of the EMI housing.

2. The gasket assembly of claim 1 wherein at least one of the plurality of fingers is positioned over the soft core.

3. The gasket assembly of claim 1 wherein at least one of the plurality of fingers is positioned adjacent the soft core.

4. The gasket assembly of claim 1 wherein at least one of the plurality of fingers partially surrounds the soft core.

5. The gasket assembly of claim 1 wherein the gasket assembly provides a low-impedance path for conducting current between the mating surfaces of the EMI housing.

6. The gasket assembly of claim 1 wherein the soft core is fabric over foam.

7. A system for reducing EMI, comprising:
an enclosure with at least one opening for EMI formed between mating conductive surfaces;
a gasket assembly provided between the mating conductive surfaces of the enclosure, the gasket assembly including a soft core for sealing the at least one opening. and the gasket assembly including a plurality of spaced-apart fingers piercing an insulating layer of at least one mating conductive surface for maintaining conductivity between the at least one mating conductive surface and another mating conductive surfaces; and
the gasket assembly configured as a resistor to reduce EMI at low frequencies, and the gasket assembly configured as an inductor in series with a resistive load to reduce EMI at higher frequencies.

8. The system of claim 7 wherein the enclosure and gasket assembly shield against emissions that cause EMI.

9. The system of claim 7 wherein the enclosure and gasket assembly shield against EMI caused by other computer systems or electronic devices.

10. The gasket assembly of claim 7 wherein the soft core is fabric over foam.

11. The system of claim 7 wherein the gasket assembly functions as a shunt capacitor in parallel to a resistive load to reduce EMI.

12. The system of claim 7 wherein the gasket assembly reduces emissions in the DC through VHF range.

13. The system of claim 7 wherein the soft core reduces emissions in the VHF through microwave range.

14. A system comprising:
enclosure means for at least partially enclosing a source of EMI in an electronic device;
means for sealing mating surfaces between the enclosure means; and
a plurality of spaced-apart fingers means for piercing an insulating layer of at least one of the mating surfaces for maintaining conductivity between the mating surfaces; and
gasket assembly means for reducing EMI with a shunt capacitor in parallel to a resistive load.

15. The system of claim 14 further comprising means for reducing emissions in the DC through microwave range.

* * * * *

UNITED STATES PATENT AND TRADEMARK OFFICE
CERTIFICATE OF CORRECTION

PATENT NO. : 7,498,524 B2  Page 1 of 1
APPLICATION NO. : 11/738895
DATED : March 3, 2009
INVENTOR(S) : Colin E. Brench It is certified that error appears in the above-identified patent and that said Letters Patent is hereby corrected as shown below:

In column 4, line 24, in Claim 7, delete "opening." and insert -- opening, --, therefor.

Signed and Sealed this

Fourth Day of August, 2009

JOHN DOLL
*Acting Director of the United States Patent and Trademark Office*